United States Patent
Fox et al.

(10) Patent No.: US 10,468,078 B2
(45) Date of Patent: Nov. 5, 2019

(54) METHODS AND SYSTEMS FOR PIN-EFFICIENT MEMORY CONTROLLER INTERFACE USING VECTOR SIGNALING CODES FOR CHIP-TO-CHIP COMMUNICATION

(71) Applicant: KANDOU LABS, S.A., Lausanne (CH)

(72) Inventors: John Fox, Lausanne (CH); Brian Holden, Monte Sereno, CA (US); Amin Shokrollahi, Preverenges (CH); Anant Singh, Pully (CH); Giuseppe Surace, Lausanne (CH)

(73) Assignee: KANDOU LABS, S.A., Lausanne (CH)

( * ) Notice: Subject to any disclaimer, the term of this patent is extended or adjusted under 35 U.S.C. 154(b) by 269 days.

(21) Appl. No.: 15/469,441

(22) Filed: Mar. 24, 2017

(65) Prior Publication Data
US 2017/0200482 A1    Jul. 13, 2017

Related U.S. Application Data

(63) Continuation of application No. 14/974,698, filed on Dec. 18, 2015, now Pat. No. 9,607,673, which is a (Continued)

(51) Int. Cl.
*G11C 7/22* (2006.01)
*G11C 7/10* (2006.01)
(Continued)

(52) U.S. Cl.
CPC ............ *G11C 7/22* (2013.01); *G06F 13/1689* (2013.01); *G06F 13/385* (2013.01);
(Continued)

(58) Field of Classification Search
CPC .............................. G11C 7/22; G06F 13/1689
See application file for complete search history.

(56) References Cited

U.S. PATENT DOCUMENTS 668,687 A    2/1901    Mayer
780,883 A    1/1905    Hinchman
(Continued)

FOREIGN PATENT DOCUMENTS

CN    1864346         11/2006
CN    101276645 A     10/2008
(Continued)

OTHER PUBLICATIONS

"Introduction to: Analog Computers and the DSPACE System," Course Material ECE 5230 Spring 2008, Utah State University, www.coursehero.com, 12 pages.
(Continued)

*Primary Examiner* — Farley Abad
(74) *Attorney, Agent, or Firm* — Invention Mine LLC (57) ABSTRACT

Systems and methods are described for transmitting data over physical channels to provide a high speed, low latency interface such as between a memory controller and memory devices. Controller-side and memory-side embodiments of such channel interfaces are disclosed which require a low pin count and have low power utilization. In some embodiments of the invention, different voltage, current, etc. levels are used for signaling and more than two levels may be used, such as a vector signaling code wherein each wire signal may take on one of four signal values.

16 Claims, 6 Drawing Sheets

| Tribit | Names | Line code (W3,W2,W1,W0) | Special use |
|---|---|---|---|
| 0b000 | H0, H_START | 1/3, 1/3, 1/3, -1 | Packet start |
| 0b001 | H1 | 1/3, 1/3, -1, 1/3 | |
| 0b010 | H2 | 1/3, -1, 1/3, 1/3 | |
| 0b011 | H3 | -1, 1/3, 1/3, 1/3 | |
| 0b100 | H4 | -1/3, -1/3, -1/3, 1 | |
| 0b101 | H5 | -1/3, -1/3, 1, -1/3 | |
| 0b110 | H6 | -1/3, 1, -1/3, -1/3 | |
| 0b111 | H7, H_IDLE | 1, -1/3, -1/3, -1/3 | Idle |

Related U.S. Application Data continuation of application No. 14/108,316, filed on Dec. 16, 2013, now Pat. No. 9,251,873.

(60) Provisional application No. 61/738,329, filed on Dec. 17, 2012.

(51) Int. Cl.
*G06F 13/42* (2006.01)
*G06F 13/16* (2006.01)
*G06F 13/38* (2006.01)
*G11C 8/10* (2006.01)

(52) U.S. Cl.
CPC ............ *G06F 13/4243* (2013.01); *G11C 7/10* (2013.01); *G11C 7/1072* (2013.01); *G11C 8/10* (2013.01); *Y02D 10/14* (2018.01); *Y02D 10/151* (2018.01)

(56) References Cited

U.S. PATENT DOCUMENTS

| | | |
|---|---|---|
| 3,196,351 A | 7/1965 | Slepian |
| 3,636,463 A | 1/1972 | Ongkiehong |
| 3,939,468 A | 2/1976 | Mastin |
| 3,970,795 A | 7/1976 | Allen |
| 4,163,258 A | 7/1979 | Ebihara |
| 4,181,967 A | 1/1980 | Nash |
| 4,206,316 A | 6/1980 | Burnsweig |
| 4,276,543 A | 6/1981 | Miller |
| 4,486,739 A | 12/1984 | Franaszek |
| 4,499,550 A | 2/1985 | Ray |
| 4,722,084 A | 1/1988 | Morton |
| 4,772,845 A | 9/1988 | Scott |
| 4,774,498 A | 9/1988 | Traa |
| 4,864,303 A | 9/1989 | Ofek |
| 4,897,657 A | 1/1990 | Brubaker |
| 4,974,211 A | 11/1990 | Corl |
| 5,017,924 A | 5/1991 | Guiberteau |
| 5,053,974 A | 10/1991 | Penz |
| 5,150,384 A | 9/1992 | Cahill |
| 5,166,956 A | 11/1992 | Baltus |
| 5,168,509 A | 12/1992 | Nakamura |
| 5,266,907 A | 11/1993 | Dacus |
| 5,283,761 A | 2/1994 | Gillingham |
| 5,287,305 A | 2/1994 | Yoshida |
| 5,311,516 A | 5/1994 | Kuznicki et al. |
| 5,331,320 A | 7/1994 | Cideciyan |
| 5,412,689 A | 5/1995 | Chan |
| 5,449,895 A | 9/1995 | Hecht |
| 5,459,465 A | 10/1995 | Kagey |
| 5,461,379 A | 10/1995 | Weinman |
| 5,510,736 A | 4/1996 | Van De Plassche |
| 5,511,119 A | 4/1996 | Lechleider |
| 5,553,097 A | 9/1996 | Dagher |
| 5,566,193 A | 10/1996 | Cloonan |
| 5,599,550 A | 2/1997 | Kohlruss |
| 5,626,651 A | 5/1997 | Dullien |
| 5,629,651 A | 5/1997 | Mizuno |
| 5,659,353 A | 8/1997 | Kostreski |
| 5,689,509 A * | 11/1997 | Gaytan ............... H04N 21/2381 348/465 |
| 5,727,006 A | 3/1998 | Dreyer |
| 5,748,948 A | 5/1998 | Yu |
| 5,802,356 A | 9/1998 | Gaskins |
| 5,825,808 A | 10/1998 | Hershey |
| 5,856,935 A | 1/1999 | Moy |
| 5,875,202 A | 2/1999 | Venters |
| 5,889,981 A * | 3/1999 | Betker ................ G06F 9/30145 712/227 |
| 5,945,935 A | 8/1999 | Kusumoto |
| 5,949,060 A | 9/1999 | Schattschneider |
| 5,982,954 A | 11/1999 | Delen |
| 5,995,016 A | 11/1999 | Perino |
| 5,999,016 A | 12/1999 | McClintock |
| 6,005,895 A | 12/1999 | Perino |
| 6,084,883 A | 7/2000 | Norrell |
| 6,084,958 A | 7/2000 | Blossom |
| 6,097,732 A | 8/2000 | Jung |
| 6,119,263 A | 9/2000 | Mowbray |
| 6,154,498 A | 11/2000 | Dabral |
| 6,172,634 B1 | 1/2001 | Leonowich |
| 6,175,230 B1 | 1/2001 | Hamblin |
| 6,226,330 B1 | 5/2001 | Mansur |
| 6,232,908 B1 | 5/2001 | Nakaigawa |
| 6,242,321 B1 | 6/2001 | Acosta et al. |
| 6,278,740 B1 | 8/2001 | Nordyke |
| 6,316,987 B1 | 11/2001 | Daily |
| 6,317,465 B1 | 11/2001 | Akamatsu |
| 6,346,907 B1 | 2/2002 | Dacy |
| 6,359,931 B1 | 3/2002 | Perino |
| 6,378,073 B1 | 4/2002 | Davis |
| 6,384,758 B1 | 5/2002 | Michalski |
| 6,398,359 B1 | 6/2002 | Silverbrook |
| 6,404,820 B1 | 6/2002 | Postol |
| 6,417,737 B1 | 7/2002 | Moloudi |
| 6,424,630 B1 | 7/2002 | Ang |
| 6,433,800 B1 | 8/2002 | Holtz |
| 6,452,420 B1 | 9/2002 | Wong |
| 6,473,877 B1 | 10/2002 | Sharma |
| 6,483,828 B1 | 11/2002 | Balachandran |
| 6,504,875 B2 | 1/2003 | Perino |
| 6,509,773 B2 | 1/2003 | Buchwald |
| 6,522,699 B1 | 2/2003 | Anderson |
| 6,556,628 B1 | 4/2003 | Poulton |
| 6,563,382 B1 | 5/2003 | Yang |
| 6,621,427 B2 | 9/2003 | Greenstreet |
| 6,621,945 B2 | 9/2003 | Bissessur |
| 6,624,699 B2 | 9/2003 | Yin |
| 6,650,638 B1 | 11/2003 | Walker |
| 6,661,355 B2 | 12/2003 | Cornelius |
| 6,664,355 B2 | 12/2003 | Kim |
| 6,686,879 B2 | 2/2004 | Shattil |
| 6,690,739 B1 | 2/2004 | Mui |
| 6,766,342 B2 | 7/2004 | Kechriotis |
| 6,772,351 B1 | 8/2004 | Werner |
| 6,839,429 B1 | 1/2005 | Gaikwad |
| 6,839,587 B2 | 1/2005 | Yonce |
| 6,854,030 B2 | 2/2005 | Perino |
| 6,865,234 B1 | 3/2005 | Agazzi |
| 6,865,236 B1 | 3/2005 | Terry |
| 6,876,317 B2 | 4/2005 | Sankaran |
| 6,898,724 B2 | 5/2005 | Chang |
| 6,927,709 B2 | 8/2005 | Kiehl |
| 6,954,492 B1 | 10/2005 | Williams |
| 6,963,622 B2 | 11/2005 | Eroz |
| 6,972,701 B2 | 12/2005 | Jansson |
| 6,973,613 B2 | 12/2005 | Cypher |
| 6,976,194 B2 | 12/2005 | Cypher |
| 6,982,954 B2 | 1/2006 | Dhong |
| 6,990,138 B2 | 1/2006 | Bejjani |
| 6,991,038 B2 | 1/2006 | Guesnon |
| 6,993,311 B2 | 1/2006 | Li |
| 6,999,516 B1 | 2/2006 | Rajan |
| 7,023,817 B2 | 4/2006 | Kuffner |
| 7,038,486 B2 | 5/2006 | Aoyama |
| 7,039,136 B2 | 5/2006 | Olson |
| 7,053,802 B2 | 5/2006 | Cornelius |
| 7,075,996 B2 | 7/2006 | Simon |
| 7,080,288 B2 | 7/2006 | Ferraiolo |
| 7,082,557 B2 | 7/2006 | Schauer |
| 7,085,153 B2 | 8/2006 | Ferrant |
| 7,085,336 B2 | 8/2006 | Lee |
| 7,127,003 B2 | 10/2006 | Rajan |
| 7,130,944 B2 | 10/2006 | Perino |
| 7,142,012 B2 | 11/2006 | Horowitz |
| 7,142,612 B2 | 11/2006 | Horowitz |
| 7,142,865 B2 | 11/2006 | Tsai |
| 7,164,631 B2 | 1/2007 | Tateishi |
| 7,167,019 B2 | 1/2007 | Broyde |
| 7,176,823 B2 | 2/2007 | Zabroda |
| 7,180,949 B2 | 2/2007 | Kleveland |
| 7,184,483 B2 | 2/2007 | Rajan |
| 7,199,728 B2 | 4/2007 | Dally |

(56) References Cited

U.S. PATENT DOCUMENTS

| | | |
|---|---|---|
| 7,231,558 B2 | 6/2007 | Gentieu |
| 7,269,130 B2 | 9/2007 | Pitio |
| 7,269,212 B1 | 9/2007 | Chau |
| 7,335,976 B2 | 2/2008 | Chen |
| 7,336,112 B1 | 2/2008 | Sha |
| 7,339,990 B2 | 3/2008 | Hidaka |
| 7,346,819 B2 | 3/2008 | Bansal |
| 7,348,989 B2 | 3/2008 | Stevens |
| 7,349,484 B2 | 3/2008 | Stojanovic |
| 7,356,213 B1 | 4/2008 | Cunningham |
| 7,358,869 B1 | 4/2008 | Chiarulli |
| 7,362,130 B2 | 4/2008 | Broyde |
| 7,362,697 B2 | 4/2008 | Becker |
| 7,366,942 B2 | 4/2008 | Lee |
| 7,370,264 B2 | 5/2008 | Worley |
| 7,372,390 B2 | 5/2008 | Yamada |
| 7,389,333 B2 | 6/2008 | Moore |
| 7,397,302 B2 | 7/2008 | Bardsley |
| 7,400,276 B1 | 7/2008 | Sotiriadis |
| 7,428,273 B2 | 9/2008 | Foster |
| 7,456,778 B2 | 11/2008 | Werner |
| 7,462,956 B2 | 12/2008 | Lan |
| 7,495,162 B1 | 2/2009 | Srebranig |
| 7,496,162 B2 | 2/2009 | Srebranig |
| 7,570,704 B2 | 4/2009 | Nagarajan |
| 7,535,957 B2 | 5/2009 | Ozawa |
| 7,539,532 B2 | 5/2009 | Tran |
| 7,583,209 B1 | 9/2009 | Duan |
| 7,599,390 B2 | 10/2009 | Pamarti |
| 7,613,234 B2 | 11/2009 | Raghavan |
| 7,616,075 B2 | 11/2009 | Kushiyama |
| 7,620,116 B2 | 11/2009 | Bessios |
| 7,633,850 B2 | 12/2009 | Ahn |
| 7,639,596 B2 | 12/2009 | Cioffi |
| 7,643,588 B2 | 1/2010 | Visalli |
| 7,650,525 B1 | 1/2010 | Chang |
| 7,656,321 B2 | 2/2010 | Wang |
| 7,694,204 B2 | 4/2010 | Schmidt |
| 7,697,915 B2 | 4/2010 | Behzad |
| 7,698,088 B2 | 4/2010 | Sul |
| 7,706,456 B2 | 4/2010 | Laroia |
| 7,706,524 B2 | 4/2010 | Zerbe |
| 7,746,764 B2 | 6/2010 | Rawlins |
| 7,768,312 B2 | 8/2010 | Yukitoshi |
| 7,787,572 B2 | 8/2010 | Scharf |
| 7,804,361 B2 | 9/2010 | Lim |
| 7,808,456 B2 | 10/2010 | Chen |
| 7,808,830 B2 | 10/2010 | Kasuta |
| 7,808,883 B2 | 10/2010 | Green |
| 7,826,551 B2 | 11/2010 | Lee |
| 7,841,909 B2 | 11/2010 | Murray |
| 7,859,356 B2 | 12/2010 | Pandey |
| 7,868,790 B2 | 1/2011 | Bae |
| 7,869,497 B2 | 1/2011 | Benvenuto |
| 7,869,546 B2 | 1/2011 | Tsai |
| 7,882,413 B2 | 2/2011 | Chen |
| 7,899,653 B2 | 3/2011 | Hollis |
| 7,907,676 B2 | 3/2011 | Stojanovic |
| 7,933,770 B2 | 4/2011 | Kruger |
| 8,000,664 B2 | 8/2011 | Khorram |
| 8,030,999 B2 | 10/2011 | Chatterjee |
| 8,036,300 B2 | 10/2011 | Evans |
| 8,050,332 B2 | 11/2011 | Chung |
| 8,055,095 B2 | 11/2011 | Palotai |
| 8,064,535 B2 | 11/2011 | Wiley |
| 8,085,172 B2 | 12/2011 | Li |
| 8,091,006 B2 | 1/2012 | Prasad |
| 8,106,806 B2 | 1/2012 | Toyomura |
| 8,149,906 B2 | 4/2012 | Saito |
| 8,159,375 B2 | 4/2012 | Abbesfer |
| 8,159,376 B2 | 4/2012 | Abbasfar |
| 8,180,931 B2 | 5/2012 | Lee |
| 8,185,807 B2 | 5/2012 | Oh |
| 8,199,849 B2 | 6/2012 | Oh |
| 8,199,863 B2 | 6/2012 | Chen |
| 8,218,670 B2 | 7/2012 | AbouRjeily |
| 8,233,544 B2 | 7/2012 | Bao |
| 8,245,094 B2 | 8/2012 | Jiang |
| 8,245,102 B1 | 8/2012 | Cory |
| 8,253,454 B2 | 8/2012 | Lin |
| 8,279,094 B2 | 10/2012 | Abbasfar |
| 8,279,745 B2 | 10/2012 | Dent |
| 8,279,976 B2 | 10/2012 | Lin |
| 8,284,848 B2 | 10/2012 | Nam |
| 8,289,914 B2 | 10/2012 | Li |
| 8,295,250 B2 | 10/2012 | Gorokhov |
| 8,295,336 B2 | 10/2012 | Lutz |
| 8,305,247 B2 | 11/2012 | Pun |
| 8,310,389 B1 | 11/2012 | Chui |
| 8,341,492 B2 | 12/2012 | Shen |
| 8,359,445 B2 | 1/2013 | Ware |
| 8,365,035 B2 | 1/2013 | Hara |
| 8,406,315 B2 | 3/2013 | Tsai |
| 8,406,316 B2 | 3/2013 | Sugita |
| 8,429,492 B2 | 4/2013 | Yoon |
| 8,429,495 B2 | 4/2013 | Przybylski |
| 8,437,440 B1 | 5/2013 | Zhang |
| 8,442,099 B1 | 5/2013 | Sederat |
| 8,442,210 B2 | 5/2013 | Zerbe |
| 8,443,223 B2 | 5/2013 | Abbasfar |
| 8,451,913 B2 | 5/2013 | Oh |
| 8,462,891 B2 | 6/2013 | Kizer |
| 8,472,513 B2 | 6/2013 | Malipatil |
| 8,620,166 B2 | 6/2013 | Dong |
| 8,498,344 B2 | 7/2013 | Wilson |
| 8,498,368 B1 | 7/2013 | Husted |
| 8,520,348 B2 | 8/2013 | Dong |
| 8,520,493 B2 | 8/2013 | Goulahsen |
| 8,539,318 B2 | 9/2013 | Cronie |
| 8,547,272 B2 | 10/2013 | Nestler |
| 8,577,284 B2 | 11/2013 | Seo |
| 8,578,246 B2 | 11/2013 | Mittelholzer |
| 8,588,254 B2 | 11/2013 | Diab |
| 8,588,280 B2 | 11/2013 | Oh |
| 8,593,305 B1 | 11/2013 | Tajalli |
| 8,602,643 B2 | 12/2013 | Gardiner |
| 8,604,879 B2 | 12/2013 | Mourant |
| 8,638,241 B2 | 1/2014 | Sudhakaran |
| 8,643,437 B2 | 2/2014 | Chiu |
| 8,644,497 B2 | 2/2014 | Clausen et al. |
| 8,649,445 B2 | 2/2014 | Cronie |
| 8,649,460 B2 | 2/2014 | Ware |
| 8,649,556 B2 | 2/2014 | Wedge |
| 8,649,840 B2 | 2/2014 | Sheppard, Jr. |
| 8,674,861 B2 | 3/2014 | Matsuno |
| 8,687,968 B2 | 4/2014 | Nosaka |
| 8,711,919 B2 | 4/2014 | Kumar |
| 8,718,184 B1 | 5/2014 | Cronie |
| 8,755,426 B1 | 6/2014 | Cronie |
| 8,773,964 B2 | 7/2014 | Hsueh |
| 8,780,687 B2 | 7/2014 | Clausen et al. |
| 8,782,578 B2 | 7/2014 | Tell |
| 8,791,735 B1 | 7/2014 | Shibasaki |
| 8,831,440 B2 | 9/2014 | Yu |
| 8,841,936 B2 | 9/2014 | Nakamura |
| 8,879,660 B1 | 11/2014 | Peng |
| 8,897,134 B2 | 11/2014 | Kern |
| 8,898,504 B2 | 11/2014 | Baumgartner |
| 8,938,171 B2 | 1/2015 | Tang |
| 8,949,693 B2 | 2/2015 | Ordentlich |
| 8,951,072 B2 | 2/2015 | Hashim |
| 8,975,948 B2 | 3/2015 | GonzalezDiaz |
| 8,989,317 B1 | 3/2015 | Holden |
| 8,996,740 B2 | 3/2015 | Wiley |
| 9,015,566 B2 | 4/2015 | Cronie |
| 9,020,049 B2 | 4/2015 | Schwager |
| 9,036,764 B1 | 5/2015 | Hossain |
| 9,059,816 B1 | 6/2015 | Simpson |
| 9,069,995 B1 | 6/2015 | Cronie |
| 9,071,476 B2 | 6/2015 | Fox et al. |
| 9,077,386 B1 | 7/2015 | Holden |
| 9,083,576 B1 | 7/2015 | Hormati |
| 9,093,791 B2 | 7/2015 | Liang |
| 9,100,232 B1 | 8/2015 | Hormati |

(56) References Cited

U.S. PATENT DOCUMENTS

| | | |
|---|---|---|
| 9,106,465 B2 | 8/2015 | Walter |
| 9,124,557 B2 | 9/2015 | Fox |
| 9,148,087 B1 | 9/2015 | Tajalli |
| 9,152,495 B2 | 10/2015 | Losh |
| 9,165,615 B2 | 10/2015 | Amirkhany |
| 9,172,412 B2 | 10/2015 | Kim |
| 9,178,503 B2 | 11/2015 | Hsieh |
| 9,183,085 B1 | 11/2015 | Northcott |
| 9,197,470 B2 | 11/2015 | Okunev |
| 9,231,790 B2 | 1/2016 | Wiley |
| 9,246,713 B2 | 1/2016 | Shokrollahi |
| 9,251,873 B1 | 2/2016 | Fox et al. |
| 9,281,785 B2 | 3/2016 | Sjoland |
| 9,288,082 B1 | 3/2016 | Ulrich |
| 9,288,089 B2 | 3/2016 | Cronie |
| 9,292,716 B2 | 3/2016 | Winoto |
| 9,300,503 B1 | 3/2016 | Holden |
| 9,306,621 B2 | 4/2016 | Zhang |
| 9,331,962 B2 | 5/2016 | Lida |
| 9,362,974 B2 | 6/2016 | Fox |
| 9,363,114 B2 | 6/2016 | Shokrollahi |
| 9,374,250 B1 | 6/2016 | Musah |
| 9,401,828 B2 | 7/2016 | Cronie |
| 9,432,082 B2 | 8/2016 | Ulrich |
| 9,432,298 B1 | 8/2016 | Smith |
| 9,444,654 B2 | 9/2016 | Hormati |
| 9,455,744 B2 | 9/2016 | George |
| 9,455,765 B2 | 9/2016 | Schumacher |
| 9,461,862 B2 | 10/2016 | Holden |
| 9,479,369 B1 | 10/2016 | Shokrollahi |
| 9,509,437 B2 | 11/2016 | Shokrollahi |
| 9,520,883 B2 | 12/2016 | Shibasaki |
| 9,537,644 B2 | 1/2017 | Jones |
| 9,544,015 B2 | 1/2017 | Ulrich |
| 9,634,797 B2 | 4/2017 | Benammar |
| 9,667,379 B2 | 5/2017 | Cronie |
| 9,710,412 B2 | 7/2017 | Sengoku |
| 9,852,806 B2 | 12/2017 | Stauffer |
| 9,917,711 B2 | 3/2018 | Ulrich |
| 10,055,372 B2 | 8/2018 | Shokrollahi |
| 2001/0006538 A1 | 7/2001 | Simon |
| 2001/0055344 A1 | 12/2001 | Lee |
| 2002/0034191 A1 | 3/2002 | Shattil |
| 2002/0044316 A1 | 4/2002 | Myers |
| 2002/0057592 A1 | 5/2002 | Robb |
| 2002/0097791 A1 | 7/2002 | Hansen |
| 2002/0152340 A1 | 10/2002 | Dreps |
| 2002/0154633 A1 | 10/2002 | Shin |
| 2002/0163881 A1 | 11/2002 | Dhong |
| 2002/0167339 A1 | 11/2002 | Chang |
| 2002/0174373 A1 | 11/2002 | Chang |
| 2002/0181607 A1 | 12/2002 | Izumi |
| 2003/0016763 A1 | 1/2003 | Doi |
| 2003/0016770 A1 | 1/2003 | Trans |
| 2003/0046618 A1 | 3/2003 | Collins |
| 2003/0085763 A1 | 5/2003 | Schrodinger |
| 2003/0086366 A1 | 5/2003 | Branlund et al. |
| 2003/0117184 A1 | 6/2003 | Fecteau |
| 2003/0146783 A1 | 8/2003 | Bandy |
| 2003/0174023 A1 | 9/2003 | Miyasita |
| 2003/0185310 A1 | 10/2003 | Ketchum |
| 2003/0218558 A1 | 11/2003 | Mulder |
| 2004/0027185 A1 | 2/2004 | Fiedler |
| 2004/0057525 A1 | 3/2004 | Rajan |
| 2004/0146117 A1 | 7/2004 | Subramaniam |
| 2004/0155802 A1 | 8/2004 | Lamy |
| 2004/0161019 A1 | 8/2004 | Raghavan |
| 2004/0169529 A1 | 9/2004 | Afghahi |
| 2004/0170231 A1 | 9/2004 | Bessios |
| 2004/0239374 A1 | 12/2004 | Hori |
| 2005/0027876 A1* | 2/2005 | Umei ............... H04L 12/42 709/231 |
| 2005/0063493 A1 | 3/2005 | Foster |
| 2005/0134380 A1 | 6/2005 | Naim |
| 2005/0174841 A1 | 8/2005 | Ho |
| 2005/0195000 A1 | 9/2005 | Parker |
| 2005/0201491 A1 | 9/2005 | Wei |
| 2005/0213686 A1 | 9/2005 | Love |
| 2005/0220182 A1 | 10/2005 | Kuwata |
| 2005/0270098 A1 | 12/2005 | Zhang |
| 2006/0013331 A1 | 1/2006 | Choi |
| 2006/0036668 A1 | 2/2006 | Jaussi |
| 2006/0097786 A1 | 5/2006 | Su |
| 2006/0103463 A1 | 5/2006 | Lee |
| 2006/0120486 A1 | 6/2006 | Visalli |
| 2006/0126751 A1 | 6/2006 | Bessios |
| 2006/0133538 A1 | 6/2006 | Stojanovic |
| 2006/0140324 A1 | 6/2006 | Casper |
| 2006/0159005 A1 | 7/2006 | Rawlins |
| 2006/0233291 A1 | 10/2006 | Garlepp |
| 2006/0236174 A1* | 10/2006 | Whetsel ............ G01R 31/3172 714/724 |
| 2006/0291589 A1 | 12/2006 | Eliezer et al. |
| 2007/0001723 A1 | 1/2007 | Lin |
| 2007/0002954 A1 | 1/2007 | Cornelius |
| 2007/0030796 A1 | 2/2007 | Green |
| 2007/0103338 A1 | 5/2007 | Teo |
| 2007/0121716 A1 | 5/2007 | Nagarajan |
| 2007/0164883 A1 | 7/2007 | Furtner |
| 2007/0182487 A1 | 8/2007 | Ozasa |
| 2007/0201546 A1 | 8/2007 | Lee |
| 2007/0204205 A1 | 8/2007 | Niu |
| 2007/0263711 A1 | 11/2007 | Kramer |
| 2007/0283210 A1 | 12/2007 | Prasad |
| 2008/0007367 A1 | 1/2008 | Kim |
| 2008/0012598 A1 | 1/2008 | Mayer |
| 2008/0016432 A1 | 1/2008 | Lablans |
| 2008/0104374 A1 | 5/2008 | Mohamed |
| 2008/0159448 A1 | 7/2008 | Anim-Appiah |
| 2008/0192621 A1 | 8/2008 | Suehiro |
| 2008/0316070 A1 | 12/2008 | Van et al. |
| 2008/0317188 A1 | 12/2008 | Staszewski |
| 2009/0046009 A1 | 2/2009 | Fujii |
| 2009/0059782 A1 | 3/2009 | Cole |
| 2009/0115523 A1 | 5/2009 | Akizuki |
| 2009/0150754 A1 | 6/2009 | Dohmen |
| 2009/0154604 A1 | 6/2009 | Lee |
| 2009/0195281 A1 | 8/2009 | Tamura |
| 2009/0262876 A1 | 10/2009 | Arima |
| 2009/0316730 A1 | 12/2009 | Feng |
| 2009/0323864 A1 | 12/2009 | Tired |
| 2009/0323884 A1 | 12/2009 | Tired |
| 2010/0046644 A1 | 2/2010 | Mazet |
| 2010/0054355 A1 | 3/2010 | Kinjo et al. |
| 2010/0081451 A1 | 4/2010 | Mueck |
| 2010/0122021 A1 | 5/2010 | Lee et al. |
| 2010/0148819 A1 | 6/2010 | Bae |
| 2010/0180143 A1 | 7/2010 | Ware |
| 2010/0215087 A1 | 8/2010 | Tsai |
| 2010/0215112 A1 | 8/2010 | Tsai |
| 2010/0215118 A1 | 8/2010 | Ware |
| 2010/0235673 A1 | 9/2010 | Abbasfar |
| 2010/0271107 A1 | 10/2010 | Tran |
| 2010/0283894 A1 | 11/2010 | Horan |
| 2010/0296556 A1 | 11/2010 | Rave |
| 2010/0309964 A1 | 12/2010 | Oh |
| 2011/0014865 A1 | 1/2011 | Seo |
| 2011/0028089 A1 | 2/2011 | Komori |
| 2011/0032977 A1 | 2/2011 | Hsiao |
| 2011/0051854 A1 | 3/2011 | Kizer |
| 2011/0072244 A1 | 3/2011 | Lindholm et al. |
| 2011/0072330 A1 | 3/2011 | Kolze |
| 2011/0074488 A1 | 3/2011 | Broyde |
| 2011/0084737 A1 | 4/2011 | Oh |
| 2011/0103508 A1 | 5/2011 | Mu |
| 2011/0127990 A1 | 6/2011 | Wilson |
| 2011/0228864 A1 | 9/2011 | Aryanfar |
| 2011/0235501 A1 | 9/2011 | Goulahsen |
| 2011/0268225 A1 | 11/2011 | Cronie |
| 2011/0286497 A1 | 11/2011 | Nervig |
| 2011/0299555 A1 | 12/2011 | Cronie |
| 2011/0302478 A1 | 12/2011 | Cronie |
| 2011/0317559 A1 | 12/2011 | Kern |
| 2011/0317587 A1 | 12/2011 | Lida et al. |

(56) References Cited

U.S. PATENT DOCUMENTS

| | | |
|---|---|---|
| 2012/0036415 A1 | 2/2012 | Shafrir |
| 2012/0082203 A1 | 4/2012 | Zerbe |
| 2012/0133438 A1 | 5/2012 | Tsuchi |
| 2012/0152901 A1 | 6/2012 | Nagorny |
| 2012/0161945 A1 | 6/2012 | Single |
| 2012/0213299 A1* | 8/2012 | Cronie .............. H04L 1/0041 375/259 |
| 2012/0243589 A1* | 9/2012 | Desjardins .......... H04L 7/005 375/222 |
| 2012/0257683 A1 | 10/2012 | Schwager |
| 2013/0010892 A1 | 1/2013 | Cronie |
| 2013/0013870 A1 | 1/2013 | Cronie |
| 2013/0088274 A1 | 4/2013 | Gu |
| 2013/0106513 A1 | 5/2013 | Cyrusian |
| 2013/0114392 A1 | 5/2013 | Sun et al. |
| 2013/0114519 A1 | 5/2013 | Gaal |
| 2013/0114663 A1 | 5/2013 | Ding |
| 2013/0129019 A1 | 5/2013 | Sorrells |
| 2013/0147553 A1 | 6/2013 | Iwamoto |
| 2013/0159584 A1 | 6/2013 | Nygren |
| 2013/0188656 A1 | 7/2013 | Ferraiolo |
| 2013/0195155 A1 | 8/2013 | Pan |
| 2013/0202065 A1 | 8/2013 | Chmelar |
| 2013/0215954 A1 | 8/2013 | Beukema |
| 2013/0259113 A1 | 10/2013 | Kumar |
| 2013/0271194 A1 | 10/2013 | Pellerano |
| 2013/0307614 A1 | 11/2013 | Dai |
| 2013/0314142 A1 | 11/2013 | Tamura |
| 2013/0315501 A1 | 11/2013 | Atanassov |
| 2013/0346830 A1 | 12/2013 | Ordentlich |
| 2014/0068391 A1 | 3/2014 | Goel |
| 2014/0159769 A1 | 6/2014 | Hong |
| 2014/0177645 A1 | 6/2014 | Cronie |
| 2014/0177696 A1 | 6/2014 | Hwang |
| 2014/0254642 A1 | 9/2014 | Fox et al. |
| 2014/0266440 A1 | 9/2014 | Itagaki |
| 2014/0269130 A1 | 9/2014 | Maeng |
| 2014/0286381 A1 | 9/2014 | Shibasaki |
| 2015/0049798 A1 | 2/2015 | Hossein |
| 2015/0070201 A1 | 3/2015 | Dedic |
| 2015/0078479 A1 | 3/2015 | Strovene |
| 2015/0117579 A1 | 4/2015 | Shibasaki |
| 2015/0146771 A1 | 5/2015 | Walter |
| 2015/0222458 A1 | 8/2015 | Hormati |
| 2015/0236885 A1 | 8/2015 | Ling |
| 2015/0249559 A1 | 9/2015 | Shokrollahi |
| 2015/0333940 A1 | 11/2015 | Shokrollahi |
| 2015/0349835 A1 | 12/2015 | Fox |
| 2015/0365263 A1 | 12/2015 | Zhang et al. |
| 2015/0380087 A1 | 12/2015 | Mittelholzer |
| 2015/0381232 A1 | 12/2015 | Ulrich |
| 2015/0381768 A1 | 12/2015 | Fox et al. |
| 2016/0020796 A1 | 1/2016 | Hormati |
| 2016/0020824 A1 | 1/2016 | Ulrich et al. |
| 2016/0036616 A1 | 2/2016 | Holden |
| 2016/0197747 A1 | 7/2016 | Ulrich |
| 2016/0218894 A1 | 7/2016 | Fox |
| 2016/0261435 A1 | 9/2016 | Musah |
| 2016/0380787 A1 | 12/2016 | Hormati et al. |
| 2017/0272285 A1 | 9/2017 | Shokrollahi et al. |
| 2017/0310456 A1 | 10/2017 | Tajalli |
| 2017/0317449 A1 | 11/2017 | Shokrollahi |
| 2017/0317855 A1 | 11/2017 | Shokrollahi |
| 2018/0299921 A1 | 10/2018 | Rajwani et al. |
| 2019/0103903 A1 | 4/2019 | Yang |

FOREIGN PATENT DOCUMENTS

| | | |
|---|---|---|
| CN | 101478286 | 7/2009 |
| CN | 101820288 | 9/2010 |
| CN | 101854223 | 10/2010 |
| CN | 101999116 A | 3/2011 |
| CN | 102254571 B | 6/2015 |
| EP | 1926267 | 5/2008 |
| EP | 2039221 | 2/2013 |
| JP | 2003163612 | 6/2003 |
| WO | 2005002162 | 1/2005 |
| WO | 2009084121 | 7/2009 |
| WO | 2010031824 | 3/2010 |
| WO | 2011119359 | 9/2011 |

OTHER PUBLICATIONS

Abbasfar, A., "Generalized Differential Vector Signaling", IEEE International Conference on Communications, ICC '09 (Jun. 14, 2009), pp. 1-5.

Brown, L., et al., "V.92: The Last Dial-Up Modem?", IEEE Transactions on Communications, IEEE Service Center, Piscataway, NJ., USA, vol. 52, No. 1, Jan. 1, 2004, pp. 54-61. XP011106836, ISSN: 0090-6779, DOI: 10.1109/tcomm.2003.822168, pp. 55-59.

Burr, "Spherical Codes for M-Ary Code Shift Keying", University of York, Apr. 2, 1989, pp. 67-72, United Kingdom.

Cheng, W., "Memory Bus Encoding for Low Power: A Tutorial", Quality Electronic Design, IEEE, International Symposium on Mar. 26-28, 2001, pp. 199-204, Piscataway, NJ.

Clayton, P., "Introduction to Electromagnetic Compatibility", Wiley-Interscience, 2006.

Counts, L., et al., "One-Chip Slide Rule Works with Logs, Antilogs for Real-Time Processing," Analog Devices Computational Products 6, Reprinted from Electronic Design, May 2, 1985, 7 pages.

Dasilva et al., "Multicarrier Orthogonal CDMA Signals for Quasi-Synchronous Communication Systems", IEEE Journal on Selected Areas in Communications, vol. 12, No. 5 (Jun. 1, 1994), pp. 842-852.

Design Brief 208 Using the Anadigm Multiplier CAM, Copyright 2002 Anadigm, 6 pages.

Ericson, T., et al., "Spherical Codes Generated by Binary Partitions of Symmetric Pointsets", IEEE Transactions on Information Theory, vol. 41, No. 1, Jan. 1995, pp. 107-129.

Farzan, K., et al., "Coding Schemes for Chip-to-Chip Interconnect Applications", IEEE Transactions on Very Large Scale Integration (VLSI) Systems, vol. 14, No. 4, Apr. 2006, pp. 393-406.

Grahame, J., "Vintage Analog Computer Kits," posted on Aug. 25, 2006 in Classic Computing, 2 pages, http.//www.retrothing.com/2006/08/classic_analog_.html.

Healey, A., et al., "A Comparison of 25 Gbps NRZ & PAM-4 Modulation used in Legacy & Premium Backplane Channels", DesignCon 2012, 16 pages.

International Search Report and Written Opinion for PCT/EP2011/059279 dated Sep. 22, 2011.

International Search Report and Written Opinion for PCT/EP2011/074219 dated Jul. 4, 2012.

International Search Report and Written Opinion for PCT/EP2012/052767 dated May 11, 2012.

International Search Report and Written Opinion for PCT/US14/052986 dated Nov. 24, 2014.

International Search Report and Written Opinion from PCT/US2014/034220 dated Aug. 21, 2014.

International Search Report and Written Opinion of the International Searching Authority, dated Jul. 14, 2011 in International Patent Application S.N. PCT/EP2011/002170, 10 pages.

International Search Report and Written Opinion of the International Searching Authority, dated Nov. 5, 2012, in International Patent Application S.N. PCT/EP2012/052767, 7 pages.

International Search Report for PCT/US2014/053563, dated Nov. 11, 2014, 2 pages.

Jiang, A., et al., "Rank Modulation for Flash Memories", IEEE Transactions of Information Theory, Jun. 2006, vol. 55, No. 6, pp. 2659-2673.

Loh, M., et al., "A 3×9 Gb/s Shared, All-Digital CDR for High-Speed, High-Density I/O", Matthew Loh, IEEE Journal of Solid-State Circuits, Vo. 47, No. 3, Mar. 2012.

Notification of Transmittal of International Search Report and the Written Opinion of the International Searching Authority, for PCT/US2015/018363, dated Jun. 18, 2015, 13 pages.

(56) References Cited

OTHER PUBLICATIONS

Notification of Transmittal of the International Search Report and the Written Opinion of the International Searching Authority, or the Declaration for PCT/EP2013/002681, dated Feb. 25, 2014, 15 pages.
Notification of Transmittal of the International Search Report and the Written Opinion of the International Searching Authority, or the Declaration, dated Mar. 3, 2015, for PCT/US2014/066893, 9 pages.
Notification of Transmittal of the International Search Report and the Written Opinion of the International Searching Authority, or the Declaration, for PCT/US2014/015840, dated May 20, 2014. 11 pages.
Notification of Transmittal of the International Search Report and the Written Opinion of the International Searching Authority, or the Declaration, for PCT/US2014/043965, dated Oct. 22, 2014, 10 pages.
Notification of Transmittal of the International Search Report and the Written Opinion of the International Searching Authority, or the Declaration, for PCT/US2015/037466, dated Nov. 19, 2015.
Notification of Transmittal of the International Search Report and the Written Opinion of the International Searching Authority, or the Declaration, for PCT/US2015/039952, dated Sep. 23, 2015, 8 pages.
Notification of Transmittal of the International Search Report and the Written Opinion of the International Searching Authority, or the Declaration, for PCT/US2015/041161, dated Oct. 7, 2015, 8 pages.
Notification of Transmittal of the International Search Report and the Written Opinion of the International Searching Authority, or the Declaration, for PCT/US2015/043463, dated Oct. 16, 2015, 8 pages.
Oh, et al., Pseudo-Differential Vector Signaling for Noise Reduction in Single-Ended Signaling, DesignCon 2009.
Poulton, et al., "Multiwire Differential Signaling", UNC-CH Department of Computer Science Version 1.1, Aug. 6, 2003.
Schneider, J., et al., "ELEC301 Project: Building an Analog Computer," Dec. 19, 1999, 8 pages, http://www.clear.rice.edu/elec301/Projects99/anlgcomp/.
She et al., "A Framework of Cross-Layer Superposition Coded Multicast for Robust IPTV Services over WiMAX," IEEE Communications Society subject matter experts for publication in the WCNC 2008 proceedings, Mar. 31, 2008-Apr. 3, 2008, pp. 3139-3144.
Skliar et al., A Method for the Analysis of Signals: the Square-Wave Method, Mar. 2008, Revista de Matematica: Teoria y Aplicationes, pp. 109-129.
Slepian, D., "Premutation Modulation", IEEE, vol. 52, No. 3, Mar. 1965, pp. 228-236.
Stan, M., et al., "Bus-Invert Coding for Low-Power I/O, IEEE Transactions on Very Large Scale Integration (VLSI) Systems", vol. 3, No. 1, Mar. 1995, pp. 49-58.
Tallini, L., et al., "Transmission Time Analysis for the Parallel Asynchronous Communication Scheme", IEEE Transactions on Computers, vol. 52, No. 5, May 2003, pp. 558-571.
Tierney, J., et al., "A digital frequency synthesizer," Audio and Electroacoustics, IEEE Transactions, Mar. 1971, pp. 48-57, vol. 19, Issue 1, 1 page Abstract from http://ieeexplore.
Wang et al., "Applying CDMA Technique to Network-on-Chip", IEEE Transactions on Very Large Scale Integration (VLSI) Systems, vol. 15, No. 10 (Oct. 1, 2007), pp. 1091-1100.
Zouhair Ben-Neticha et al, "The 'streTched'-Golay and other codes for high-SNR fnite-delay quantization of the Gaussian source at ½ Bit per sample, IEEE Transactions on Communications, vol. 38, No. 12 Dec. 1, 1990, pp. 2089-2093, XP000203339, ISSN: 0090-6678, DOI: 10.1109/26.64647.
Notification of Transmittal of the International Search Report and the Written Opinion of the International Searching Authority, or the Declaration, dated Feb. 15, 2017, 10 pages.
Notification of Transmittal of the International Search Report and the Written Opinion of the International Searching Authority, or the Declaration., for PCT/US17/14997, dated Apr. 7, 2017.
Shibasaki, et al., "A 56-Gb/s Receiver Front-End with a CTLE and 1-Tap DFE in 20-nm CMOS", IEEE 2014 Symposium on VLSI Circuits Digest of Technical Papers, 2 pgs.
Hidaka, et al., "A 4-Channel 1.25-10.3 Gb/s Backplane Transceiver Macro With35 dB Equalizer and Sign-Based Zero-Forcing Adaptive Control", IEEE Journal of Solid-State Circuits, vol. 44 No. 12, Dec. 2009, pp. 3547-3559.
Holden, B., "Using Ensemble NRZ Coding for 400GE Electrical Interfaces", IEEE 8023 400GE Study Group, May 17, 2013, 24 pages, http://www.ieee802.org/3/400GSG/public/13_05/holden_400_01_0513.pdf.
Holden, B., "An exploration of the technical feasibility of the major technology options for 400GE backplanes", IEEE 802.3 400GE Study Group, Jul. 16, 2013, 18 pages, http://ieee802.org/3/400GSG/public/13_07/holden_400_01_0713.pdf.
Holden, B., "Simulation results for NRZ, ENRZ & PAM-4 on 16-wire full-sized 400GE backplanes", IEEE 802.3 400GE Study Group, Sep. 2, 2013, 19 pages, www.ieee802.0rg/3/400GSG/publiv/13_09/holden_400_01_0913.pdf.
Giovaneli, et al., "Space-frequency coded OFDM system for multi-wire power line communications", Power Line Communications and Its Applications, 20015 International Symposium on Vancouver, BC, Canada, Apr. 6-8, 2005, Piscataway, NJ, pp. 191-195.
Anonymous , "Constant-weight code", Wikipedia.org, retrieved on Feb. 6, 2017, (3 pages).
Elmhurst, Daniel , et al., "A 1.8 128-Mb 125-MHz Multi-level Cell Flash Memory With Flexible Read While Write", IEEE Journal of Solid-State Circuits, vol. 38, No. 11, Nov. 2003, 1929-1933 (5 pages).

\* cited by examiner

| Tribit | Names | Line code (W3,W2,W1,W0) | Special use |
|---|---|---|---|
| 0b000 | H0, H_START | 1/3, 1/3, 1/3, -1 | Packet start |
| 0b001 | H1 | 1/3, 1/3, -1, 1/3 | |
| 0b010 | H2 | 1/3, -1, 1/3, 1/3 | |
| 0b011 | H3 | -1, 1/3, 1/3, 1/3 | |
| 0b100 | H4 | -1/3, -1/3, -1/3, 1 | |
| 0b101 | H5 | -1/3, -1/3, 1, -1/3 | |
| 0b110 | H6 | -1/3, 1, -1/3, -1/3 | |
| 0b111 | H7, H_IDLE | 1, -1/3, -1/3, -1/3 | Idle |

METHODS AND SYSTEMS FOR PIN-EFFICIENT MEMORY CONTROLLER INTERFACE USING VECTOR SIGNALING CODES FOR CHIP-TO-CHIP COMMUNICATION

CROSS REFERENCES

This application is a Continuation of U.S. application Ser. No. 14/974,698, filed Dec. 18, 2015, entitled "Methods and Systems for Pin-Efficient Memory Controller Interface using Vector Signaling Codes for Chip-to-Chip Communication," which is a continuation of U.S. application Ser. No. 14/108,316, filed Dec. 16, 2013, entitled "Methods and Systems for Pin-Efficient Memory Controller Interface using Vector Signaling Codes for Chip-to-Chip Communication," which is a non-provisional application claiming priority under 35 USC § 119 to U.S. Provisional Application No. 61/738,329, filed Dec. 17, 2012, entitled "Methods And Systems For Pin-Efficient Memory Controller Interface Using Vector Signaling Codes For Chip-To-Chip Communication," all of which are hereby incorporated herein by reference.

The following references are herein incorporated by reference in their entirety for all purposes:

U.S. Patent Publication 2011/0268225 of U.S. patent application Ser. No. 12/784,414, filed May 20, 2010, naming Harm Cronie and Amin Shokrollahi, entitled "Orthogonal Differential Vector Signaling" (hereinafter "Cronie I");

U.S. Patent Publication 2011/0302478 of U.S. patent application Ser. No. 12/982,777, filed Dec. 30, 2010, naming Harm Cronie and Amin Shokrollahi, entitled "Power and Pin Efficient Chip-to-Chip Communications with Common-Mode Resilience and SSO Resilience" (hereinafter "Cronie II");

U.S. patent application Ser. No. 13/030,027, filed Feb. 17, 2011, naming Harm Cronie, Amin Shokrollahi and Armin Tajalli, entitled "Methods and Systems for Noise Resilient, Pin-Efficient and Low Power Communications with Sparse Signaling Codes" (hereinafter "Cronie III"); and U.S. patent application Ser. No. 13/463,742, filed May 3, 2012, naming Harm Cronie and Amin Shokrollahi, entitled "Finite State Encoders and Decoders for Vector Signaling Codes" (hereafter called "Cronie IV").

U.S. patent application Ser. No. 13/603,107, filed Sep. 9, 2012, naming Brian Holden and Amin Shokrollahi, entitled "Methods and Systems for Selection of Unions of Vector Signaling Codes for Power and Pin Efficient Chip-To-Chip Communication" (hereinafter called "Holden I").

U.S. patent application Ser. No. 13/671,426, filed Nov. 7, 2012, naming Brian Holden and Amin Shokrollahi, entitled "Crossbar Switch Decoder for Vector Signaling Codes" (hereinafter called "Holden II").

BACKGROUND

In communication systems, information may be transmitted from one physical location to another. Furthermore, it is typically desirable that the transport of this information is reliable, is fast and consumes a minimal amount of resources. One of the most common information transfer mediums is the serial communications link, which may be based on a single wire circuit relative to ground or other common reference, multiple such circuits relative to ground or other common reference, or multiple circuits used in relation to each other. An example of the latter utilizes differential signaling (DS). Differential signaling operates by sending a signal on one wire and the opposite of that signal on a paired wire; the signal information is represented by the difference between the wires rather than their absolute values relative to ground or other fixed reference.

Differential signaling enhances the recoverability of the original signal at the receiver, over single ended signaling (SES), by cancelling crosstalk and other common-mode noise, but a side benefit of the technique is that the Simultaneous Switching Noise (SSN) transients generated by the two signals together is nearly zero; if both outputs are presented with an identical load, the transmit demand on its power supply will be constant, regardless of the data being sent. Any induced currents produced by terminating the differential lines in the receiver will similarly cancel out, minimizing noise induction into the receiving system.

There are a number of signaling methods that maintain the desirable properties of DS while increasing pin-efficiency over DS. Many of these attempts operate on more than two wires simultaneously, using binary signals on each wire, but mapping information in groups of bits.

Vector signaling is a method of signaling. With vector signaling, pluralities of signals on a plurality of wires are considered collectively although each of the plurality of signals may be independent. Each of the collective signals is referred to as a component and the number of plurality of wires is referred to as the "dimension" of the vector. In some embodiments, the signal on one wire is entirely dependent on the signal on another wire, as is the case with DS pairs, so in some cases the dimension of the vector may refer to the number of degrees of freedom of signals on the plurality of wires instead of the number of wires in the plurality of wires.

With binary vector signaling, each component takes on a coordinate value (or "coordinate", for short) that is one of two possible values. As an example, eight SES wires may be considered collectively, with each component/wire taking on one of two values each signal period. A "code word" of this binary vector signaling is one of the possible states of that collective set of components/wires. A "vector signaling code" or "vector signaling vector set" is the collection of valid possible code words for a given vector signaling encoding scheme. A "binary vector signaling code" refers to a mapping and/or set of rules to map information bits to binary vectors.

With non-binary vector signaling, each component has a coordinate value that is a selection from a set of more than two possible values. A "non-binary vector signaling code" refers to a mapping and/or set of rules to map information bits to non-binary vectors.

Examples of vector signaling methods are described in Cronie I, Cronie II, Cronie III, and Cronie IV.

BRIEF SUMMARY

In accordance with at least one embodiment of the invention, processes and apparatuses provide for transmitting data over physical channels to provide a high speed, low latency interface such as between a memory controller and memory devices, requiring low pin count and providing low power utilization. Controller-side and memory-side embodiments of such channel interfaces are disclosed. In some embodiments of the invention, different voltage, current, etc. levels are used for signaling and more than two levels may be used, such as a ternary vector signaling code wherein each wire signal has one of three values.

This Brief Summary is provided to introduce a selection of concepts in a simplified form that are further described below in the Detailed Description. This Brief Summary is not intended to identify key or essential features of the claimed subject matter, nor is it intended to be used as an aid in determining the scope of the claimed subject matter. Other objects and/or advantages of the present invention will be apparent to one of ordinary skill in the art upon review of the Detailed Description and the included drawings.

BRIEF DESCRIPTION OF THE DRAWINGS

Various embodiments in accordance with the present disclosure will be described with reference to the drawings. Same numbers are used throughout the disclosure and figures to reference like components and features.

DETAILED DESCRIPTION

Specialized memory subsystems of modern computer systems utilize dedicated memory controllers to manage access, optimize performance, and improve utilization and reliability. Interconnections between these memory controllers and memory devices must operate at high speeds, delivering reliable and low latency data transfers, while under significant constraints in terms of available pin count and power utilization. Moreover, the design for interfaces to such interconnections is further constrained by implementation requirements, as controller devices are typically implemented using high speed logic processes, while memory devices such as DRAM rely on specialized processes optimized for high storage density and low leakage, but possibly not for fast logic speed. Thus, a successful memory-to-controller interconnection architecture must support implementation in multiple semiconductor processes.

In accordance with at least one embodiment of the invention, this disclosure describes a PHY (Physical Layer interface) and a Link Layer interface for both the controller and memory sides of such an interconnection, without presumption of limitation to the single embodiment provided as a descriptive example. Similarly, a packet format for communication of addressing, data transfer, and control operations using such an interconnection and interfaces is described, as one descriptive use example of a low-latency, pin- and power-efficient embodiment of the invention.

For purposes of description, this document uses the name "Bee" to describe this controller-to-memory interconnection system and/or a device embodying an interface for such interconnection. Without loss of generality, the physical interface between memory controller and memory device is herein described as utilizing point-to-point wire connections between integrated circuit devices, optionally including multidrop bussed interconnection of multiple memory devices and a single controller. Other embodiments of the invention may utilize other physical interfaces, including optical, inductive, capacitive, or electrical interconnection, and/or having more complex connection topologies.

Figure 1:
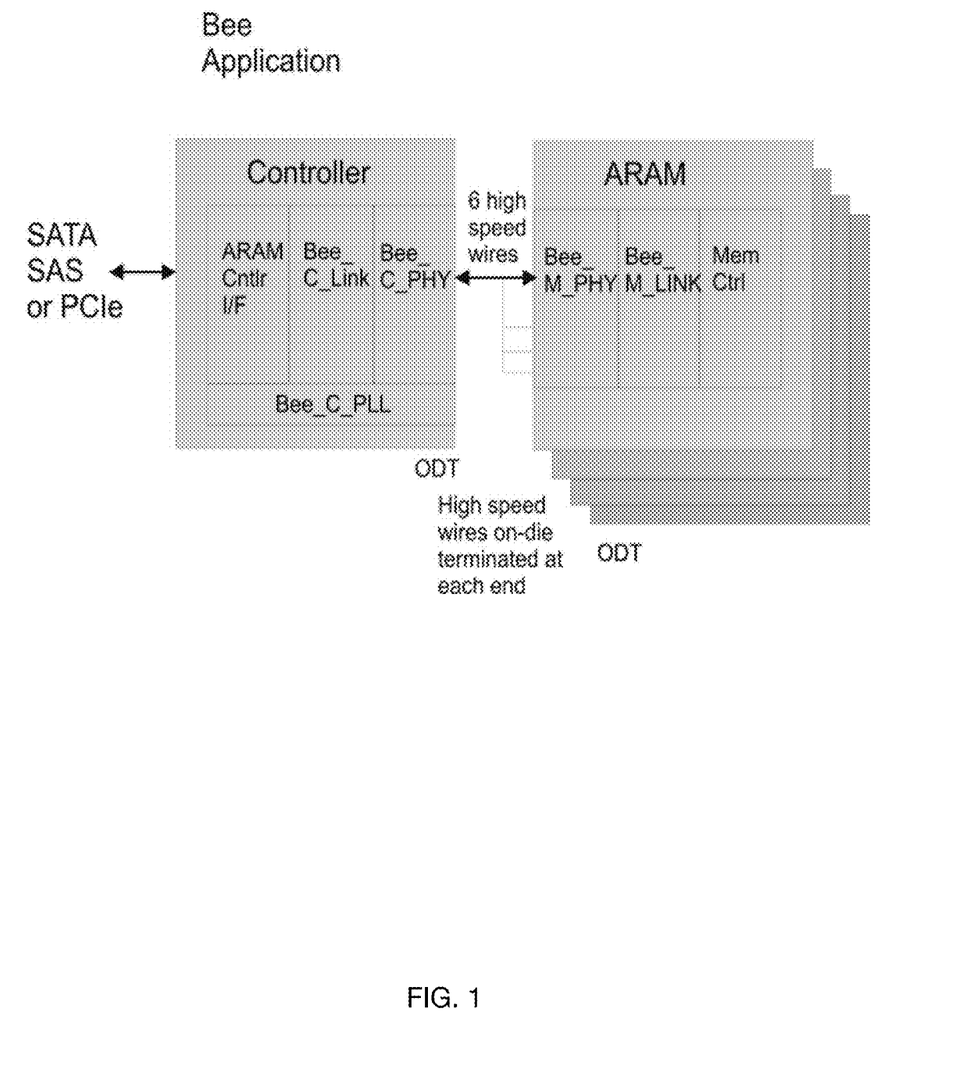
FIG. 1 is a block diagram of an example system comprised of a controller, host interface, memory interface, and memory, in accordance with at least one embodiment of the invention.
Figure 2:
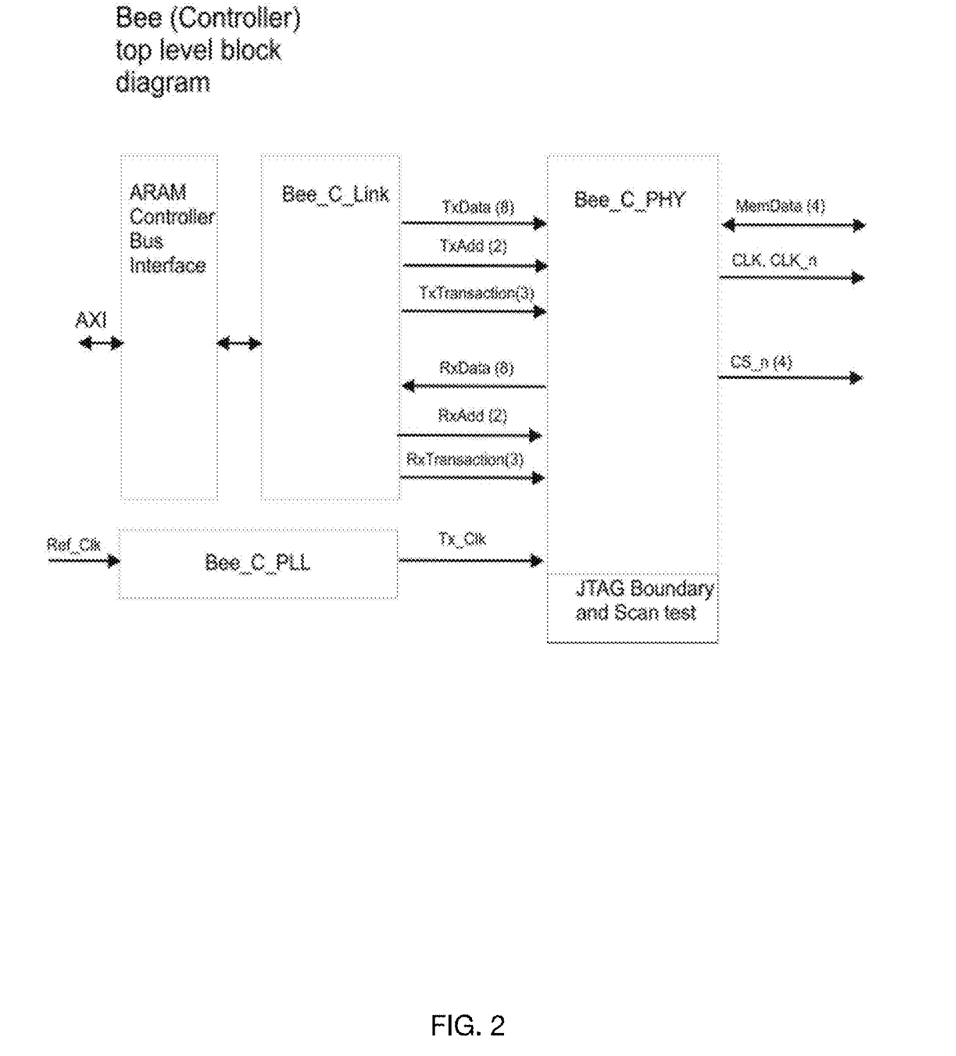
FIG. 2 is a block diagram detailing the controller side of the controller-to-memory interface, in accordance with at least one embodiment of the invention.

FIG. 2 is a block diagram detailing the controller side of the controller-to-memory interface, in accordance with at least one embodiment of the invention.

The Bee Controller side is composed of the Bee_C_Link link layer interface and the Bee_C_PHY physical layer interface. FIG. 2 is a block diagram detailing the controller side of the controller-to-memory interface, in accordance with at least one embodiment of the invention.

The Bee_C_PHY Hard IP packet physical layer interface is implemented in a 60 nm (or so) process and is a low power ensemble coded interface that can deliver 1.5 GB/s in each direction throughput over six high-speed physical wires: four bidirectional data wires and two clock wires. It is optimized for low power. In one embodiment, the interface is a four-wire H4 ensemble mode delivering a 3b4w interface, including six high speed wires total including a differential clock. The interface uses 33% transmitted line power as compared to differential signaling scheme and operates at 4 Gbaud/sec symbol rate, and providing either 1 GB/s or 1.5 GB/s throughput in each direction. In some embodiments, the interface has 3.6 mw/Gbps (43.6 mw) worst case power dissipation (12 Gb/s), and is configured to have 0.50 mm square footprint for interface elements in integrated circuit design. The device interfaces to 1-4 memory devices and connects to the link layer interface (Bee_C_LINK). It may be configured with a 24 bit parallel interface from Bee_C_LINK to PHY and use Command and Address multiplexing implemented in Bee_C_LINK.

In some embodiments, the Package and Channel either does not use equalization or utilizes simple equalization. In general, no skew tolerance circuits required, and a 50 mm FR4 trace maximum channel length may be used. Some embodiments utilize in-package MCM. The interfaces are wire-bond compatible, and may have a tileable layout to allow additional memory interfaces to be implemented on the controller. The pin-out may be chosen to minimize EMI.

Figure 7:
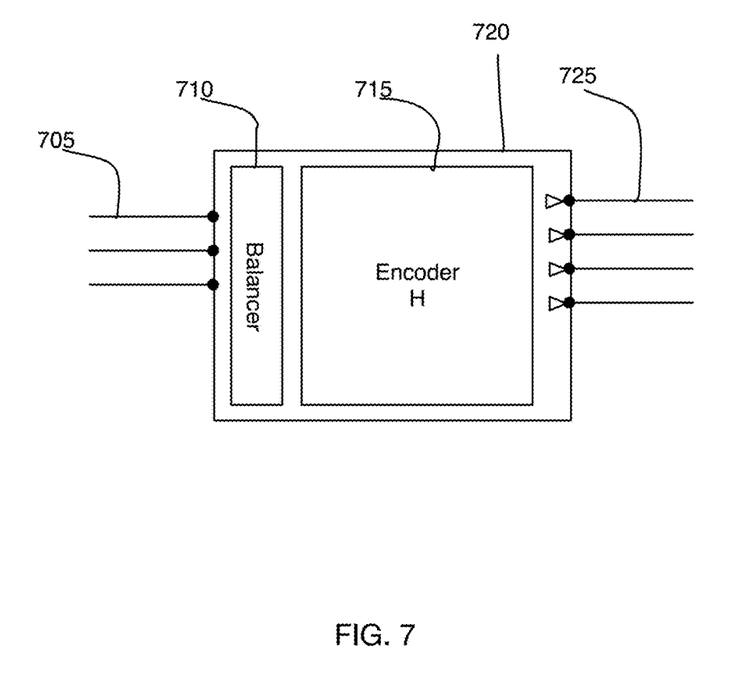
FIG. 7 illustrates a block diagram of a Gearbox, in accordance with some embodiments.

In some embodiments, the transmitter sends a half rate clock at either 1.33 GHz or 2 GHz, and data is sent to be aligned to center of rising clock edge, thus no clock and data recovery (CDR) circuit is needed in the RAM. The transmitter slew rate is controlled. The device accepts transaction start and end interface signals from Bee_C_LINK and the device selection may also be input from Bee_C_LINK. In some embodiments, there is a Gearbox selector from the 24 bit system interface to the 3 bit encoder input. The transmitter also encodes a 3-bit input plus start input into a H4 symbol. FIG. 7 illustrates an exemplary encoder that may be included in the Gearbox. As shown in FIG. 7, a Gearbox 720 may make use of a Hadamard matrix H of size n=4. The input 705 of the transformer includes n−1=3 signals which enter the balancer 710. The output of the balancer 710 includes n=4 signals which enter the encoder 715. A task of the encoder 715 is to perform the multiplication of the Hadamard matrix H with the vector of n=4 signals leaving the balancer 710. The output of the encoder 715 corresponds to the vector that is formed by multiplying H with the vector of signals leaving the balancer 710. The output of the encoder 715 is fed to the signal path driver drivers 725 which possibly perform additional amplification and/or filtering. The transmitter may drive four single ended chip select signals at half speed, and is configured in some embodiments to drive the H_IDLE H4 symbol before the chip select is asserted and then the H_START H4 symbol after the chip select is asserted.

The receiver may be configured with on-die channel termination, and the application of the termination may be determined by the statically wired external pin. In some embodiments, the Bee_C_LINK delivers the receive transaction timing to the PHY, and the Bee_C_LINK delivers the device selection. Further, the decoder may be configured to transform H4 symbols into tri-bits plus the start symbol. The Gearbox transforms the tri-bits plus the start and end packet indications into a 24-bit interface to Bee_C_LINK. Some embodiments may include a Phase aligner aligned via a boot-time routine. The receiver may have low power consumption when all input wires are at the common mode.

Power Management functions may include (i) power-down by removal of power from entire memory device; (ii) power-up transition is not very fast (milliseconds); (iii) standby-Active transitions controlled by input from the controller; and/or (v) additional moderate power standby mode.

Manufacturing aspects may include (i) marginable manufacturing loopback BERT test that is useful in-system between Bee devices; (ii) JTAG 1149.6 boundary and internal scan; (iii) 1 KV HBM and 250 V CDM ESD tolerance; and/or (iv) capable of being fully characterized & extended life tested post-silicon.

Figure 3:
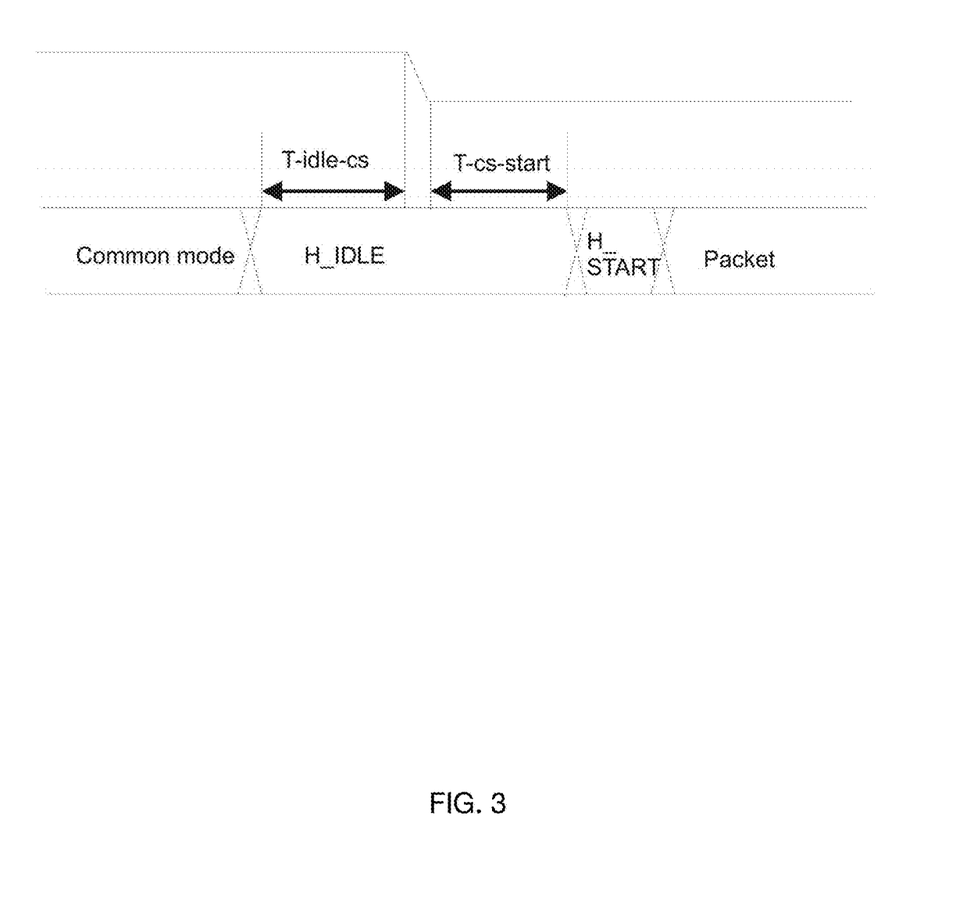
FIG. 3 is a timing diagram for the controller-to-memory interface packet start timing from the aspect of the memory controller, in accordance with at least one embodiment of the invention.

FIG. 3 is a timing diagram for the controller-to-memory interface packet start timing from the aspect of the memory controller, in accordance with at least one embodiment of the invention.

The Bee_C_PLL Hard IP packet physical layer interface is implemented in a 60 nm (or so) process. It is optimized for low power. The phase locked loop (PLL) may be configured as a 22 mw shareable PLL with 100 MHz input and 2 GHz multi-phase output. In some embodiments the PLL may be shared amongst multiple interfaces and/or may be integrated with other device functions.

The Bee_C_Link Hard IP physical layer interface is implemented in a 60 nm (or so) process that multiplexes and times the data for the Bee_C_PHY. It is optimized for low power. It may be configured to connect to a RAM controller containing an AXI bus controller. It also connects to the Bee_C_PHY.

System-side Transmit accepts full memory transactions from the memory controller and formats those transactions into Kandou Memory Link (KML) packets. The interface is configured to interoperate with at least a subset of the OFNI command set to operate the bi-directional request-response data bus. It may be configured to postpends a link CRC, and also to drive those packets into a FIFO along with the start and end of packet information. The interface may manage the Tx FIFO occupancy by pessimistically back-pressuring the bus interface taking into account the input from the receive side. In some embodiments, the interface implements a link layer retry protocol, at the cost of increased latency.

The PHY-side transmit includes a 24 bit interface out of the FIFO to the Bee_C_PHY, and also drives the start and end of packet timing into the gearbox in the Bee_C_PHY.

The PHY-side receive circuit provides the timing windows for the Bee_C_PHY to look for the H_START packet indication, and also provides the Bee_C_PHY and end of packet signal derived from the P Length field. The receive circuit also accepts a 24 bit input from the interface from Bee_C_PHY and drives it into the FIFO. It may be configured to use cut-thru operations for low latency. The receiver may also check the link CRC and writes the results into the FIFO.

The system-side receive circuit may be configured to manage the Rx FIFO occupancy by pessimistically back-pressuring the Tx side bus interface taking into account both the Rx-FIFO needs of incoming transactions and the existing Rx-FIFO occupancy. It may also be configured to perform response matching of returned packets and handling link layer packets via a non-FIFO path. The receiver circuit also formats the KML responses back into memory transactions suitable for input to the AXI bus controller. In some embodiments, it may also implement a link layer retry protocol, at the cost of latency.

Figure 4:
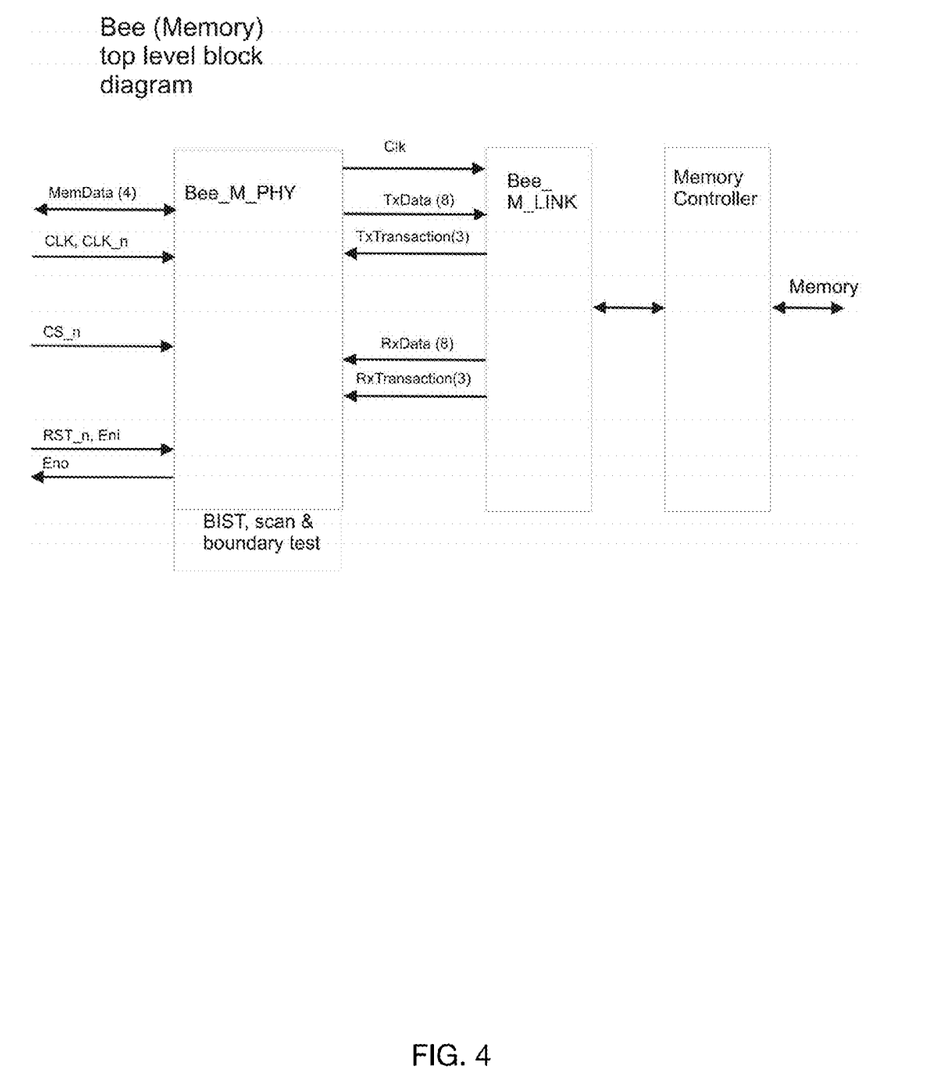
FIG. 4 is a block diagram detailing the memory side of the controller-to-memory interface, in accordance with at least one embodiment of the invention.

The Bee RAM side comprises the Bee_M_PHY physical layer interface and the Bee_M_Link.link layer interface. FIG. 4 is a block diagram detailing the memory side of this controller-to-memory system, in accordance with at least one embodiment of the invention.

The matching Bee_M_PHY Hard IP (RAM Side) packet physical layer interface is implemented in a DRAM-optimized process that is equivalent to a 100 to 130 nm CMOS process (1 to 1.2 V Vdd), is low power, and uses one of Kandou's vector signaling codes. It is optimized for low power. The differences from the controller-side interface include the following.

Some embodiments may include an additional processor interface accessible from the link. It may be configured to connect to link layer IP (Bee_M_LINK). It may be configured to consume 6.4 mw/Gbps (76.9 mw) worst case power dissipation (12 Gb/s), and be implemented with a 0.95 mm square of implementation footprint for interface elements in DRAM integrated circuit design. The transmitter sends data on each rising edge of the received clock, and the transmitter slew rate is controlled. Multi-drop support is provided via the combination of the chip select assertion and the enumeration. The H_IDLE signal line is driven within a fixed interval after chip select assertion qualified with the enumeration, while the H_START signal line is driven within a fixed interval after the H_IDLE signal line is driven. The Bee_M_LINK delivers a 24 bit interface to the PHY and provides transaction timing to PHY. In some embodiments, it is configured in accordance with a 4:1 parallel implementation.

The Receiver is configured with on-die termination, and a statically wired external pin determines whether termination is applied. In some embodiments, no PLL or CDR is required, as it is configured with DDR forwarded differential clock. When the chip select is asserted, the PHY circuit is configured to finds the H_IDLE and H_START H4 symbols. The decoder transforms H4 symbols into tri-bits plus the start symbol. In addition, the Gearbox transforms the tri-bits plus the start symbol into a 24-bit interface to Bee_M_LINK. The circuit is configured for low power consumption when all input wires are floating at the common mode, and may include a 1:4 parallel implementation.

Power management functions may include (i) power down by removal of power and/or (ii) fast resumption low power standby mode with the state of the wires controlled, rapid detection and indication of activity on the clock, and standby-active transitions via a state machine based on the clock activity.

Manufacturing aspects include (i) marginable manufacturing loopback BERT test that is useful in-system between Bee devices; (ii) JTAG 1149.6 boundary and internal scan; (iii) 1 KV HBM and 250 V CDM ESD tolerance; and (iv) fully characterized and extended life tested post-silicon.

Figure 5:
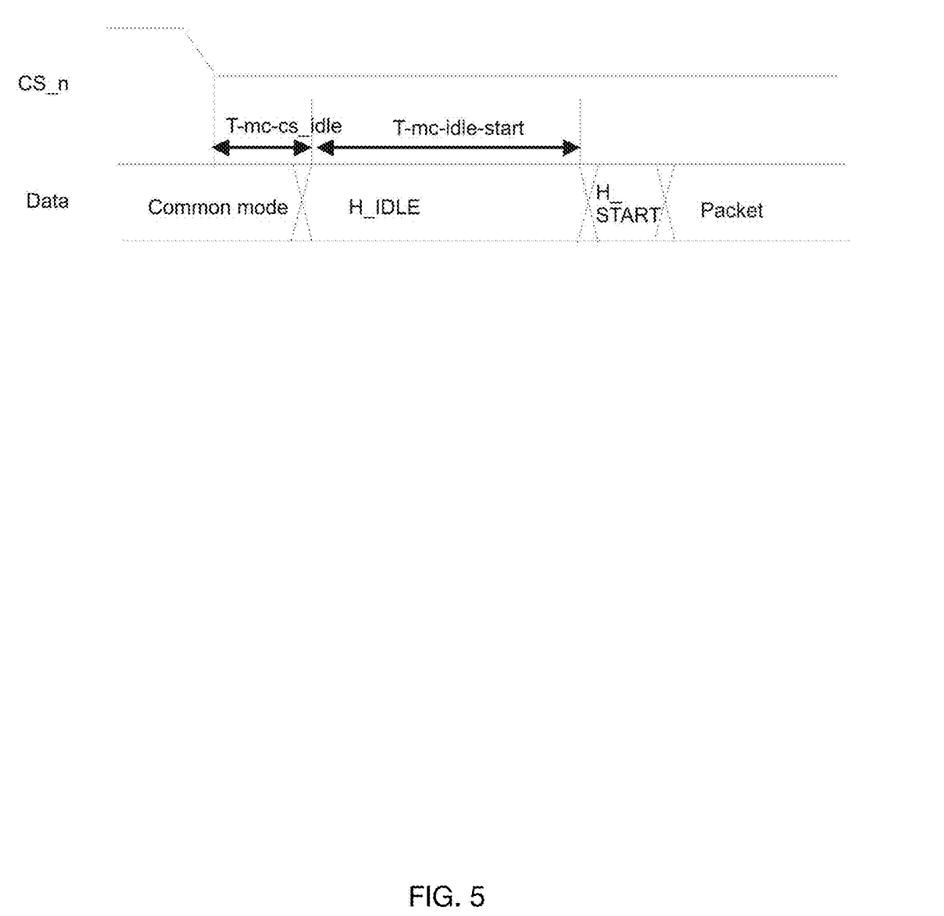
FIG. 5 is a timing diagram for the controller-to-memory packet start timing from the aspect of the memory device, in accordance with at least one embodiment of the invention.

FIG. 5 is a timing diagram for the controller-to-memory packet start timing from the aspect of the memory device, in accordance with at least one embodiment of the invention.

The Bee_M_Link Hard IP physical layer interface is, in some embodiments, implemented in a 60 nm process that multiplexes and times the data for the Bee_M_PHY. It is optimized for low power. The interface connects to the Bee_M_PHY and to the memory controller inside of the RAM.

The PHY-side receive circuit provides the timing windows for the Bee_M_PHY to look for the H_START packet indication and provides the Bee_M_PHY and end of packet signal derived from the P Length field. It may be configured to accept a 24 bit input from the interface from Bee_M_PHY and drives it into the FIFO, and may use cut-thru operation for low latency. The receive circuit writes the results of the CRC calculation after the packet into the FIFO.

The memory-side receiver circuit manages the 24 bit wide Rx FIFO occupancy by pessimistically back-pressuring the Tx side bus interface taking into account Rx-FIFO needs of incoming transactions and the existing Rx-FIFO occupancy. The receiver also: (i) performs response matching of returned packets; (ii) handles link layer packets via a non-FIFO path; (iii) formats the KML responses back into bus transactions suitable for handling by the memory controller; and/or (iv) implements a link layer retry protocol, at the cost of increased latency.

The memory-side transmit circuit is configured to (i) accept full bus transactions from the memory controller; (ii) format those transactions into Kandou Memory Link (KML) packets; (iii) is compatible with the OFNI command set to operate the bi-directional request-response data bus; (iv) prepends a fixed link layer preamble; (v) postpends a link CRC; (vi) drives those packets into a 24 bit wide FIFO along with the start and end of packet information; (vii) manages the Tx FIFO occupancy by pessimistically back-pressuring the bus interface taking into account the input from the receive side; and in some embodiments implements a link layer retry protocol, at the cost of increased latency.

The PHY-side transmit circuit drives a 24 bit wide interface out of the FIFO to the Bee_M_PHY and drives the start and end of packet timing into the gearbox in the Bee_M_PHY.

The enumeration function automatically enumerates a daisy chain of memory devices using the ENi and ENo pins to extend the addressability of the chip selects as per the OFNI specification or an extension of that specification.

Figure 6:
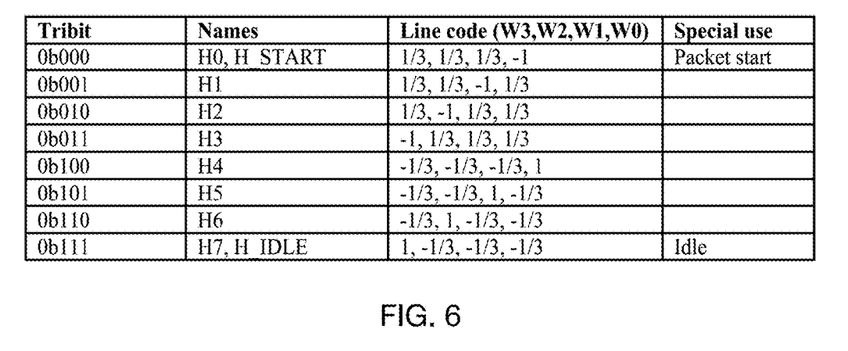
FIG. 6 describes a use of the Kandou H4 Line Code as part of a communications protocol in accordance with at least one embodiment of the invention.

A gearbox according to present embodiments can be succinctly described in terms of a class of matrices known to those of skill in the art as Hadamard matrices. A Hadamard matrix of size n is a square matrix of size n which contains as entries either +1 or −1, and for which any two different rows are orthogonal. A square matrix in which different rows are orthonormal is known as an orthogonal matrix in the literature. Therefore, a Hadamard matrix with normalized rows and columns is an orthogonal matrix. In what follows, the term "Hadamard matrix" may be read as "Hadamard matrix with normalized rows and/or columns" unless clearly contradicted by context. FIG. 6 describes a use of the Kandou H4 Line Code as part of a communications protocol in accordance with at least one embodiment of the invention. KH4C is a 3b4w (3 bits over 4 wires) code appropriate for narrow high performance interfaces. The H4 code is generated using a size n=4 Hadamard matrix. It is a balanced code of four symbols per codeword, one symbol taking on the value +1 or −1, with the remaining three symbols taking on the value −⅓ or +⅓, respectively.

Another embodiment of the invention supports a 3b5w (3-bits conveyed over 5 wires) code where each data value may be encoded as either of two equivalent codewords. Alternation of such equivalent codewords provides an effective return clock, making receipt of a sequence of such code words self-clocking. Another embodiment provides two additional clock lines that a selected memory device uses to reflect its received clock back to the controller, similarly providing synchronization of symbols transmitted in the memory-to-controller direction.

The following is a description of the Kandou Memory Link (KML) protocol, in accordance with at least one embodiment of the invention. KML is a protocol appropriate for a high-speed, narrow interface to a memory device. It supports variable-size block write and block read operations at arbitrary start addresses, with data transfer integrity verified using a cyclic-redundancy check code. The protocol may also optionally support access to link-level command/information packets for use by additional control and monitoring applications.

The memory side send a response packet or a link layer packet.

In the memory to controller direction, a 1 symbol preamble is added: H_START.

In the controller to memory direction, a 1 symbol preamble is added: H_START.

Write Packets
    P_Command—8 bits
    P_SeqNum—4 bits (TBD—if retry)
    P_Tag—4 bits
    P_Address—32 bit
    P_Length—8 bits
    P_Data—8 to 2048 bits
    P_CRC—8 to 32 bits Read Request Packets
    P_Command—8 bits
    P_SeqNum—4 bits (TBD—if retry)
    P_Tag—4 bits
    P_Address—32 bit
    P_Length—8 bits
    P_CRC—8 to 32 bits Response Packets
    P_Command—8 bits
    P_SeqNum—4 bits (TBD—if retry)
    P_Tag—4 bits
    P_Length—8 bits
    P_Data—8 to 2048 bits
    P_CRC—8 to 32 bits Link Layer Packets (for some embodiments)
    P_Command—8 bits
    P_Info—16 bits
    P_CRC—8 to 32 bits In one embodiment, a collection of interconnection signal lines; a memory-controller interface circuit; a link layer signaling protocol control circuit; a physical layer signaling protocol control circuit that maps symbols of a vector signaling code to the collection of interconnection signal lines and provides timing information for symbol communication, wherein the link layer signaling protocol circuit provides bidirectional address and data transmission to the memory controller interface circuit. The collection of interconnection signal lines may take the form of four bidirectional data lines and two clock lines. In a further embodiment, the physical layer signaling protocol control circuit communicates three data bits over the four data lines using a balanced code of symbols having four distinct signal levels. The collection of interconnection signal lines may additionally comprise two clock lines carrying a return clock signal to the controller device. In yet a further embodiment, the collection of interconnection lines comprises five bidirectional data lines and two clock lines. In a further embodiment, the physical layer signaling protocol control circuit may communicate three data bits over five lines, and the link layer protocol circuit is self-clocking in the memory-to-controller direction.

In a further embodiment, a method comprises: transmitting messages from a memory controller using a vector signaling code, the messages selected from the group consisting of a memory write, a memory read, and a status interrogation command; receiving a response message in the form of one or more vector signaling codes, the response message selected from the group consisting of a memory write complete, a memory read result, a status response, and an error report message, wherein each transmitted message and received response message comprises a series of vector signaling code words, each code word communicated as symbols carried as physical signals on a set of lines, and wherein consecutive code words of each message is synchronized by a symbol clock also carried as physical signals on the set of lines. The memory write and memory read operations may be configured to access a contiguous block of memory of a specified size at a specified memory address. The set of lines in one embodiment comprises four bidirectional data lines and two unidirectional symbol clock lines. In a further embodiment, the vector signaling code communicates three binary bits on four lines using a balanced code of four levels. In other embodiments, the series of vector signaling words corresponding to the response message is self-clocking. The self-clocking may be obtained by receipt of a physical clock signal at the memory controller. The self-clocking may be obtained by alternation of redundant code words of the vector signaling code representing the same data value.

What is claimed is:

1. A method comprising:
   obtaining memory transaction data at a link layer memory interface, and responsively forming a high-speed memory link packet having a set of multi-bit words;
   storing each multi-bit word of the high-speed memory link packet as an entry in a first-in-first-out (FIFO) buffer;
   obtaining, at an orthogonal signaling physical layer, a multi-bit word from the FIFO buffer, and consecutively encoding portions of the obtained multi-bit word into data codewords of an H4 balanced vector signaling code, wherein each data codeword comprises four symbols, one symbol having a value ±1 and a remaining three symbols having a value ∓⅓, respectively;
   transmitting a pre-designated packet start codeword of the balanced vector signaling code via high-speed data wires of a multi-wire bus; and
   transmitting each data codeword via the high-speed data wires of the multi-wire bus.

2. The method of claim 1, further comprising formulating link layer packets at a first link layer controller for transmission over the orthogonal signaling physical layer to a second link layer controller.

3. The method of claim 1, further comprising transmitting chip-select signals via chips-select wires of the multi-wire bus.

4. The method of claim 1, further comprising transmitting a clock signal over a pair of high-speed clock wires of the multi-wire bus.

5. The method of claim 1, further comprising transmitting a pre-designated idle codeword prior to transmitting the pre-designated packet start codeword.

6. The method of claim 1, wherein the high-speed memory link packet is one of a memory write packet and a memory read request packet.

7. The method of claim 1, wherein the high-speed memory link packet is a memory read result packet.

8. The method of claim 1, wherein packet start and packet end timing is further obtained at the physical layer from the link layer memory interface.

9. An apparatus comprising:
   a link layer memory interface configured to obtain memory transaction data, to responsively form a high-speed memory link packet having a set of multi-bit words, and to store each multi-bit word of the high-speed memory link packet as an entry in a first-in-first-out (FIFO) buffer; and
   an orthogonal signaling physical layer configured to:
      obtain a multi-bit word from the FIFO buffer, and to consecutively encode portions of the obtained multi-bit word into data codewords of an H4 balanced vector signaling code, wherein each data codeword comprises four symbols, one symbol having a value ±1 and a remaining three symbols having a value ∓⅓, respectively;
      transmit a pre-designated packet start codeword of the balanced vector signaling code via high-speed data wires of a multi-wire bus; and
      transmit each data codeword via the high-speed data wires of the multi-wire bus.

10. The apparatus of claim 9, wherein the link layer is configured to formulate link layer packets at a first link layer controller for transmission over the orthogonal signaling physical layer to a second link layer controller.

11. The apparatus of claim 9, wherein the orthogonal signaling physical layer is further configured to transmit chip-select signals via chips-select wires of the multi-wire bus.

12. The apparatus of claim 9, wherein the orthogonal signaling physical layer is further configured to transmit a clock signal over a pair of high-speed clock wires of the multi-wire bus.

13. The apparatus of claim 9, wherein the orthogonal signaling physical layer is further configured to transmit a pre-designated idle codeword prior to transmitting the pre-designated packet start codeword.

14. The apparatus of claim 9, wherein the high-speed memory link packet is one of a memory write packet and a memory read request packet.

15. The apparatus of claim 9, wherein the high-speed memory link packet is a memory read result packet.

16. The apparatus of claim 9, wherein the physical layer is further configured to obtain packet start and packet end timing from the link layer memory interface.

* * * * *